United States Patent
Lee

(10) Patent No.: US 8,258,559 B2
(45) Date of Patent: Sep. 4, 2012

(54) IMAGE SENSOR PHOTODIODE ARRANGEMENT

(75) Inventor: Byoung-Su Lee, Yeosu-si (KR)

(73) Assignee: Siliconfile Technologies Inc., Seoul (KR)

( * ) Notice: Subject to any disclaimer, the term of this patent is extended or adjusted under 35 U.S.C. 154(b) by 173 days.

(21) Appl. No.: 12/741,931

(22) PCT Filed: Nov. 10, 2008

(86) PCT No.: PCT/KR2008/006603
§ 371 (c)(1),
(2), (4) Date: May 7, 2010

(87) PCT Pub. No.: WO2009/066894
PCT Pub. Date: May 28, 2009

(65) Prior Publication Data
US 2010/0264464 A1    Oct. 21, 2010

(30) Foreign Application Priority Data
Nov. 20, 2007    (KR) .................. 10-2007-0118182

(51) Int. Cl.
*H01L 31/062* (2006.01)
*H01L 31/113* (2006.01)

(52) U.S. Cl. . 257/292; 257/288; 257/322; 257/E21.053; 257/E21.135; 257/E21.325; 257/E21.352; 257/E21.362; 257/E21.363; 257/E21.366; 257/E31.115

(58) Field of Classification Search .................. 257/288, 257/292, 318, 320, 321, 322, E21.053, E21.135, 257/E21.325, E21.352, E21.362, E21.363, 257/E21.366, E31.115
See application file for complete search history.

(56) References Cited

U.S. PATENT DOCUMENTS

| | | | | |
|---|---|---|---|---|
| 6,462,365 B1 * | 10/2002 | He et al. | ......................... | 257/292 |
| 6,642,076 B1 * | 11/2003 | Yaung et al. | .................... | 438/48 |
| 6,649,950 B2 * | 11/2003 | He et al. | ......................... | 257/292 |
| 6,818,930 B2 * | 11/2004 | Mouli et al. | ................... | 257/215 |
| 7,811,850 B2 * | 10/2010 | Mouli et al. | ................... | 438/75 |

FOREIGN PATENT DOCUMENTS

| | | | |
|---|---|---|---|
| JP | 2005-175104 | A | 6/2005 |
| KR | 10-2002-0022248 | A | 3/2002 |
| KR | 10-2003-0090871 | A | 12/2003 |
| KR | 10-2004-0038225 | A | 5/2004 |
| KR | 10-2006-0091074 | A | 8/2006 |

OTHER PUBLICATIONS

International Search Report mailed on Jul. 14, 2009 in Application No. PCT/KR2008/006603.
Written Opinion of the International Searching Authority mailed on Jul. 14, 2009 in Application No. PCT/KR2008/006603.

* cited by examiner

*Primary Examiner* — David Nhu
(74) *Attorney, Agent, or Firm* — Kile Park Goekjian Reed & McManus PLLC

(57) ABSTRACT

The present invention relates to a technology for reducing dark current noise by discharging electrons accumulated on a surface of an image sensor photodiode. In an N-type or P-type photodiode, a channel is formed between the photodiode and a power voltage terminal, so that electrons (or holes) accumulated on a surface of the photodiode are discharged to the power voltage terminal through the channel.

6 Claims, 6 Drawing Sheets

(a)   (b)

IMAGE SENSOR PHOTODIODE ARRANGEMENT

BACKGROUND OF THE INVENTION

1. Field of the Invention

The present invention relates to an image sensor, and more particularly, to a photodiode for an image sensor by which dark current noise is reduced by providing a channel capable of discharging electrons accumulated on the surface of the photodiode.

2. Description of the Related Art

In general, an image sensor is a semiconductor device for converting optical signals into electric signals, and has a photo-sensing unit for sensing light and a logic circuit unit for processing the sensed light into electric signals to provide data. In a complementary metal-oxide semiconductor (CMOS) image sensor, MOS transistors are provided as many as the number of pixels using a CMOS technology, and a switching method is employed to sequentially detect output current using the transistors.

Typically, a unit pixel of an image sensor consists of a photodiode corresponding to the photo-sensing unit and four MOS transistors, which includes a transfer transistor used for delivering photo-charges generated from the photodiode to a floating node; a reset transistor used for discharging electrons stored in a floating diffusing area to detect signals; a drive transistor used as a source follower; and a selection transistor used for switching and addressing operations.

FIGS. 1A and 1B are a layout diagram and a cross-sectional view, respectively, illustrating a conventional N-type image sensor.

A P-type bulk semiconductor substrate (P+bulk) 21 having a high doping concentration is connected to a ground terminal GND, and a N-type impurity layer (PDN) 23 is formed inside a P-type semiconductor layer (P-sub) 22 having a low doping concentration. A P-type impurity layer (PDP) 24 having a high P-doping concentration is formed on the N-type impurity layer 23. In addition, a gate oxide film 27 is formed beneath a transfer gate 13, so that the transfer gate 13 is electrically insulated. The floating diffusion region (FD) 12 is connected to the photodiode (PD) 11 through the transfer gate 13. In addition, the floating diffusion region 12 is connected to a power voltage terminal (VDD) 15 through a reset gate (Rx) 14. In addition, a shallow trench isolation (STI) 25 and a channel stop layer (CST) 26 are formed to provide electrical isolation from an adjacent floating diffusion region 12 and connect the surface to the ground terminal GND.

FIG. 2 illustrates an equivalent circuit of the conventional N-type image sensor semiconductor of FIGS. 1A and 1B. Now, its operation will be described.

The reset transistor M1 is turned on when a voltage of the power voltage terminal 15 is supplied to the reset gate 14 of the reset transistor M1. In response, the voltage of the power voltage terminal 15 is delivered to the floating diffusion region 12 through the reset transistor M1, and the voltage of the floating diffusion region 12 is boosted.

Then, the transfer transistor M2 is turned on when the voltage of the power voltage terminal 15 is supplied to the transfer gate (Tx) 13 of the transfer transistor M2. In response, the boosted voltage of the floating diffusion region 12 is delivered to the cathode of the photodiode 11. As a result, the voltage is applied to the photodiode 11 in a reverse direction. Therefore, a depletion region of the photodiode 11 is enlarged.

When the voltages of the transfer gate 13 of the transfer transistor M2 and the reset gate 14 of the reset transistor M1 are switched to the voltage of the ground terminal GND, the transfer transistor M2 and the reset transistor M1 are turned off, so that the photodiode 11 is reversely biased.

FIG. 3 is a diagram for describing energy bands along a line B-B' of FIG. 1B. When light is incident to the band, the light passing through the gate oxide film 27 creates an electron-hole pair inside a semiconductor. The light is diminished by the creation of the electron-hole pair, and light intensity and electron-hole pair generation density depending on a depth are also shown in FIG. 3.

Referring to FIG. 3, the electrons generated from the N-type impurity layer (PDN) 23 are directed to a center of the N-type impurity layer (PDN) 23, and holes are directed to the P-type impurity layer (PDP) 24 or the P-type bulk semiconductor substrate (P+bulk) 21. The holes directed to the P-type impurity layer (PDP) 24 are discharged via the channel stop layer 26, the bulk semiconductor substrate 21, and the ground terminal GND.

Specifically, the holes pass through the following path:
(1) P-type Impurity Layer 24→Channel Stop Layer 26→Bulk Semiconductor Substrate 21; or
(2) N-type Impurity Layer 23→Bulk Semiconductor Substrate 21.

On the contrary, the electrons may have a different path depending on where they come from. For example, the electrons generated from the N-type impurity layer (PDN) 23 are directed to a center of the N-type impurity layer (PDN) 23. However, the electrons generated from the surface of the photodiode 11 are accumulated on the surface of the photodiode 11 due to a surface band. When the amount of electrons accumulated on the surface of the photodiode 11 increases, the height of the surface band also increases, and the surface electrons flow to the N-type impurity layer (PDN) 23.

FIG. 4 is a timing chart of a signal supplied to the transfer gate 13 and the reset gate (Rx) 14.

Electrons may be generated from the surface of the photodiode 11 by thermal excitation as well as incident light. When the electrons generated by thermal excitation flow to the N-type impurity layer 23, they may produce dark noise, by which a signal may be erroneously generated even in a dark environment. This becomes a main factor of degrading dark characteristics of the photodiode.

Furthermore, in the conventional photodiode structure, the surface band serves as a barrier for blocking electric charges coming from the surface of the photodiode 11 and considerably affects characteristics of the photodiode. The surface band sensitively depends on a doping profile near the surface of the photodiode 11. Nevertheless, since the photodiode cannot appropriately discharge the electrons generated near the surface, it may be also sensitively affected by a surface potential sensitive to the doping profile of the surface. As a result, variations between pixels inevitably occur.

Such a phenomenon may similarly happen in a P-type photodiode. In the P-type photodiode, holes instead of electrons are accumulated on the surface.

As described above, in the conventional image sensor photodiode, when the electrons generated from the surface of the photodiode by thermal excitation flow to the N-type impurity layer, they may produce dark noise, by which a signal is erroneously generated even in a dark environment, and degrade dark characteristics of the photodiode.

Furthermore, since the photodiode cannot appropriately discharge the electric charges generated near the surface of the photodiode, it may be also sensitively affected by a surface potential sensitive to the doping profile of the surface. As a result, variations between pixels inevitably occur.

SUMMARY OF THE INVENTION

The present invention provides a path for discharging remaining electric charges that are generated from the surface of the photodiode but cannot be discharged to a substrate. The remaining electric charges may flow inside the photodiode or into a floating diffusion region along the surface, and then, generate dark current noise.

According to the present invention, in an N-type or P-type photodiode, a channel is provided between the photodiode and a power voltage terminal, so that electrons (or holes) accumulated on the surface of the photodiode are discharged to the power voltage terminal through the channel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Hereinafter, exemplary embodiments of the present invention will be described in detail with reference to the accompanying drawings.

Figure 1:
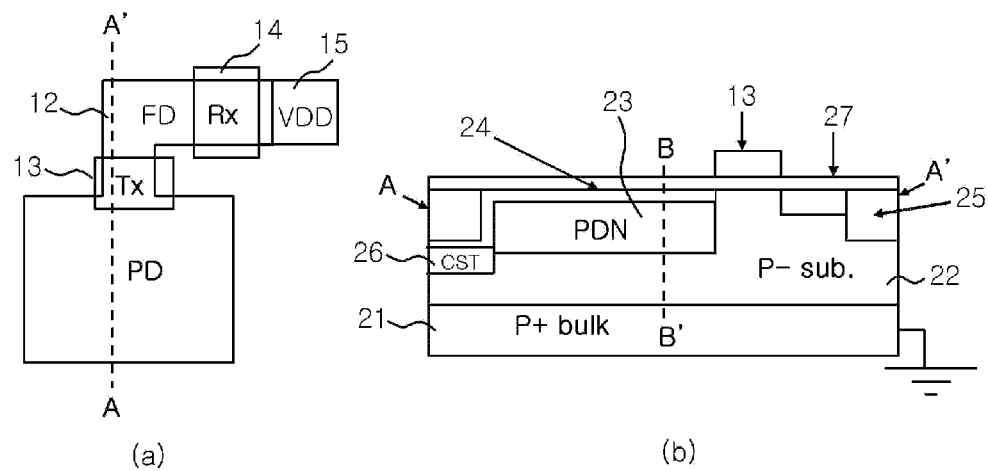
FIG. 1A is a layout diagram illustrating a conventional N-type image sensor.
FIG. 1B is a cross-sectional view along a line A-A' of FIG. 1A.
Figure 2:
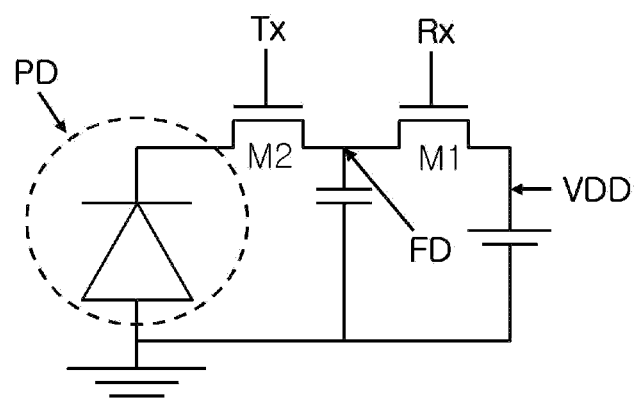
FIG. 2 is an equivalent circuit diagram of FIG. 1A.
Figure 3:
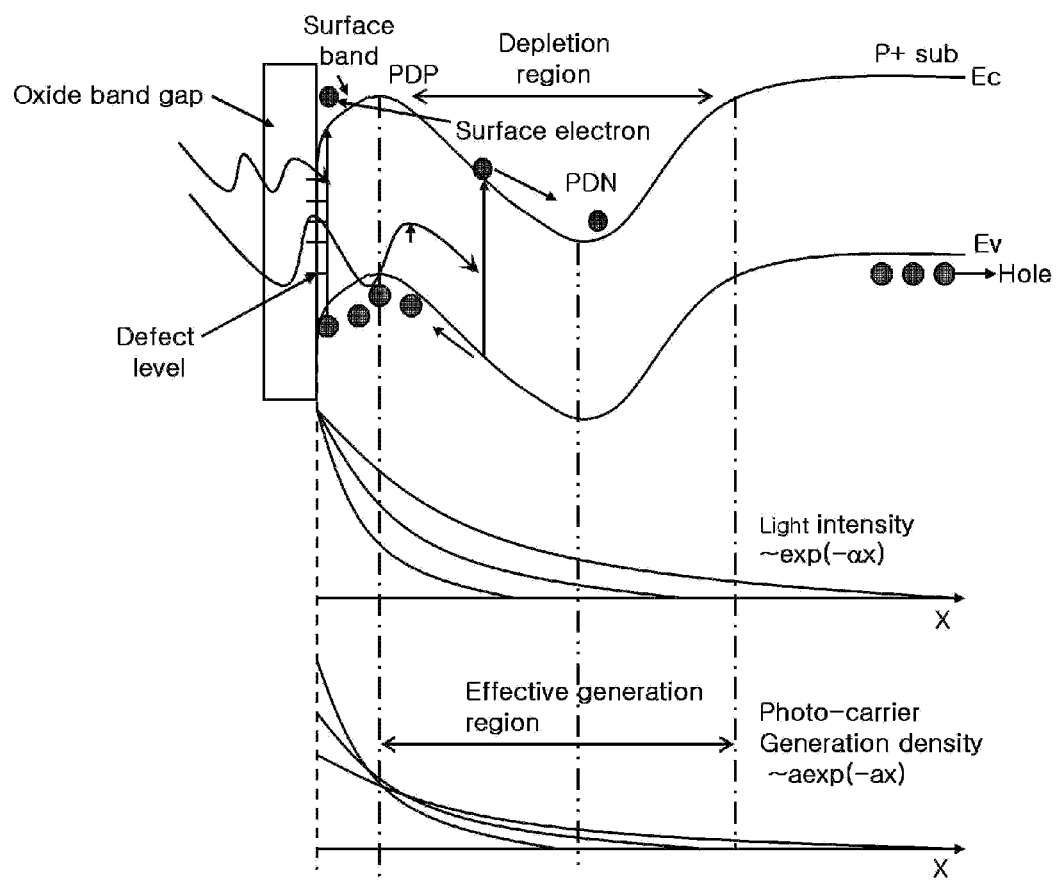
FIG. 3 is a diagram for describing energy bands along a line B-B' of FIG. 1B.
Figure 4:
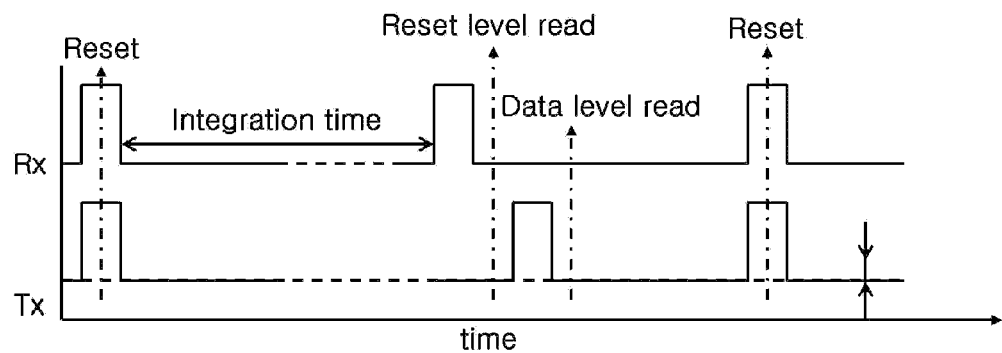
FIG. 4 is a timing chart of a signal supplied to a transfer gate and a reset gate in a conventional photodiode.
Figure 5:
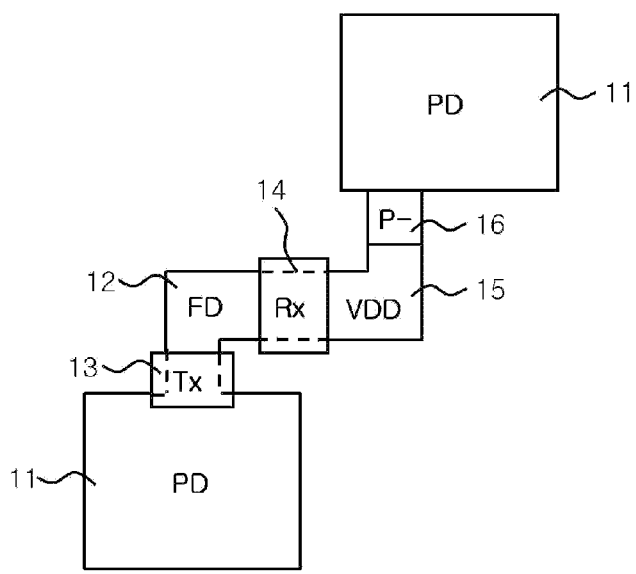
FIG. 5 is a layout diagram illustrating an image sensor photodiode according to the first embodiment of the present invention.

FIG. 5 is a layout diagram illustrating a unit pixel of an image sensor according to an exemplary embodiment of the present invention. Referring to FIG. 5, the unit pixel of an image sensor according to the present invention includes: a photodiode (PD) 11 which is defined in a field region as a predetermined shape and formed in an active region; a floating diffusion region (FD) 12 arranged in a vertical direction to the photodiode 11; a transfer gate (Tx) 13 of a transfer transistor which is formed in an active region between the photodiode 11 and the floating diffusion region 12, partially overlapped with the photodiode 11, and arranged in parallel with the photodiode 11; a reset gate (Rx) 14 of a reset transistor which is formed in an active region at one side of the floating diffusion region 12 and arranged in a vertical direction to the transfer gate 13; a power voltage terminal (VDD) 15 which is formed in one side of the reset gate 14 and receives a power voltage; and a P-type (or N-type) active layer 16 which is formed between the power voltage terminal 15 and the photodiode 11 to discharge electrons accumulated on a surface of the photodiode 11. Hereinafter, operations of the aforementioned configuration will be described in detail with reference to the accompanying drawings.

FIG. 5 illustrates the first embodiment of the present invention. Referring to FIG. 5, the photodiode 11 and the power voltage terminal 15 are electrically connected to each other through a P-type (or N-type) active layer 16 having a low doping concentration.

In a typical photodiode, while holes (or electrons) of electric charges generated from thermal effect or light incident to the surface are discharged to the substrate through a path on the surface, the electrons (or holes) are accumulated on the surface, or flow to the N-type impurity layer (or P-type impurity layer) inside the photodiode. Therefore, the electrons (or holes) accumulated on the surface or absorbed into the N-type impurity layer (or P-type impurity layer) may flow to the floating diffusion region through the transfer gate and generate noise when the voltage of the power voltage terminal VDD is supplied to the transfer gate of the transfer transistor.

Taking this into consideration, in the photodiode according to the present invention, the electrons (or holes) generated from the surface of the photodiode 11 move into the power voltage terminal 15 through the active layer 16. Therefore, they cannot be accumulated on the surface or flow to the P-type (or N-type) impurity layer 24 or 23.

Figure 7:
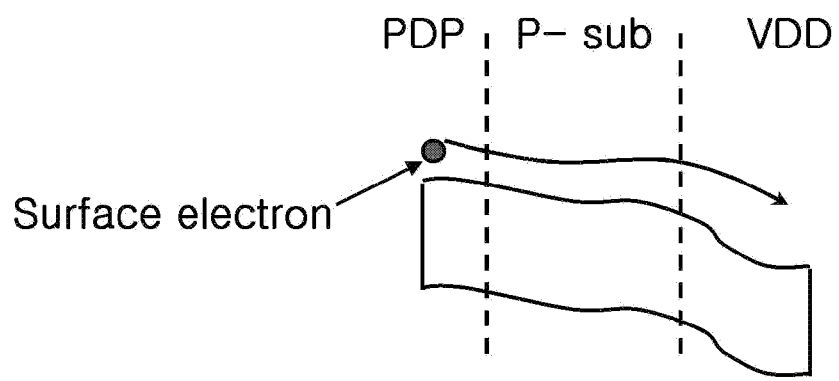
FIG. 7 is a diagram for describing a path for delivering electrons generated from a surface of a photodiode according to the present invention.

According to the present invention, the electrons generated from the surface of the photodiode 11 moves along a path shown in FIG. 7. Specifically, the electrons generated near the surface of the photodiode and moved into the surface (i.e., surface electrons) are discharged to the power voltage terminal 15 along the surface of the active layer 16 and the N+ doped surface of the power voltage terminal 15.

As a result, the photodiode according to the present invention can have little dark current. Since electrons are not accumulated on the surface of the photodiode, the photodiode according to the present invention is not sensitively affected by a surface doping profile, and thus, pixel variations can be prevented.

Figure 6:
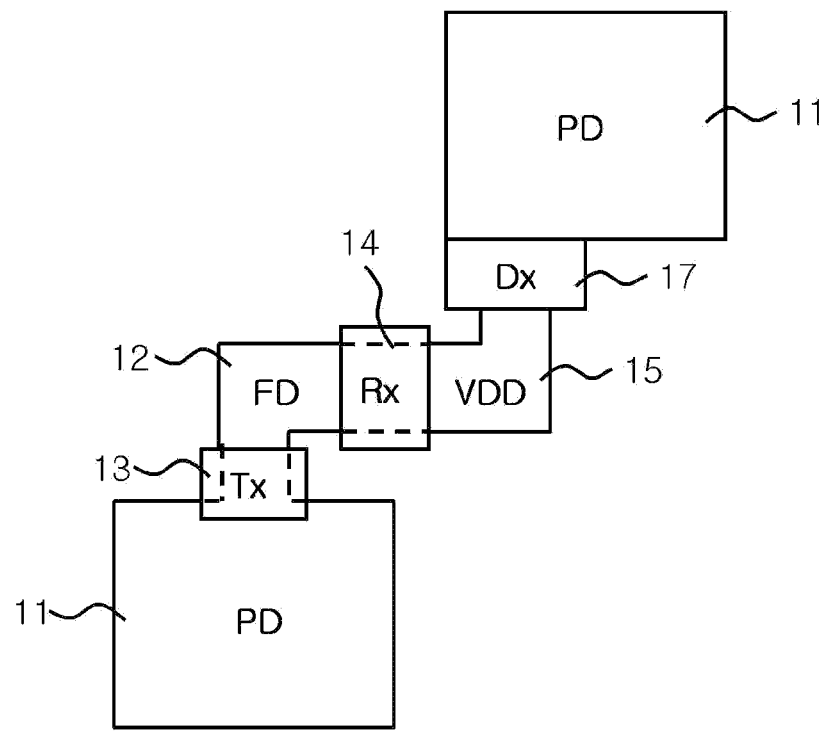
FIG. 6 is a layout diagram illustrating an image sensor photodiode according to the second embodiment of the present invention.

FIG. 6 illustrates the second embodiment of the present invention. Referring to FIG. 6, the photodiode 11 and the power voltage terminal 15 are electrically connected to each other through a muting gate (Dx) 17. Preferably, a threshold voltage Vt of the muting gate 17 is set to 0.4 to 0.6V.

Figure 8:
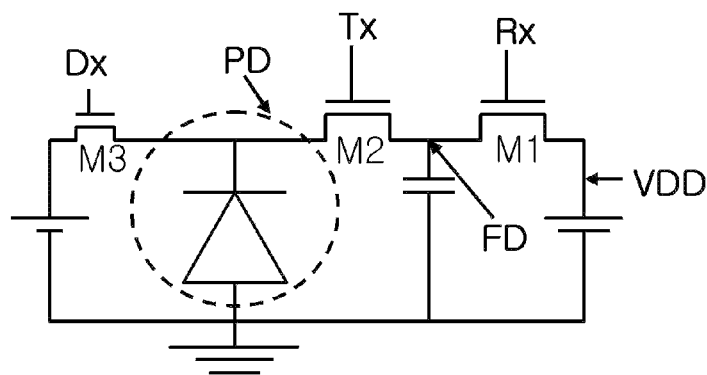
FIG. 8 is an equivalent circuit diagram of FIG. 6.

FIG. 8 illustrates an equivalent circuit of components designed as shown in FIG. 6. Referring to FIG. 8, when a voltage higher than the threshold voltage Vt set to 0.4 to 0.6V is supplied to the muting gate 17, the surface of the photodiode 11 and the power voltage terminal 15 are electrically connected to each other through the muting gate 17.

Accordingly, the electrons generated by thermal excitation due to incident light or defects on the surface of the photodiode 11 cannot flow inside the photodiode 11, but they are discharged to the power voltage terminal 15.

Figure 9:
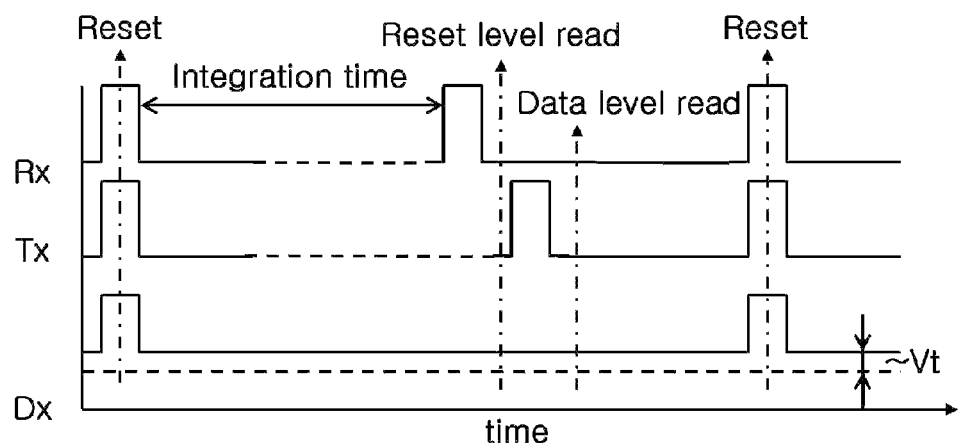
FIG. 9 is a timing chart of a gate according to an embodiment of the present invention.

As a result, a similar effect to the first embodiment can be obtained. In this case, the timing of the gate may be controlled as shown in FIG. 9.

Figure 10:
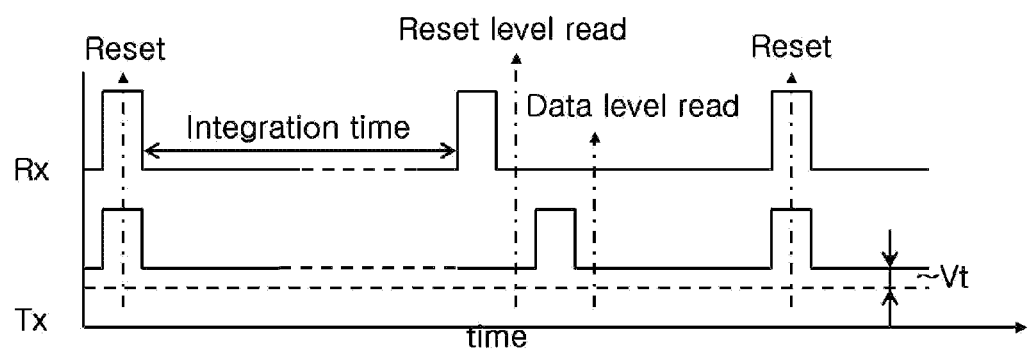
FIG. 10 is a timing chart of a gate according to another embodiment of the present invention.

According to the third embodiment of the present invention, the electrons (or holes) generated from the surface of the photodiode are discharged to the power voltage terminal using a typical photodiode structure. FIG. 10 illustrates a timing chart of a gate according to the third embodiment of the present invention.

According to the third embodiment of the present invention, in order to remove the electrons generated from the surface of the photodiode 11, the voltage of the power voltage terminal 15 is applied to the transfer gate 13 during an integration time period to electrically connect the surface of the photodiode 11 and the floating diffusion region 12 to each other.

In a typical case, the voltage of the power voltage terminal 15 is supplied when the transfer gate 13 is turned on, and the voltage of the ground terminal GND is supplied when the transfer gate 13 is turned off. On the contrary, according to the present invention, the voltage of the power voltage terminal 15 is supplied when the transfer gate 13 is turned on, and the threshold voltage Vt is applied when the transfer gate 13 is turned off, so that the electrons (or holes) generated from the surface of the photodiode 11 are removed.

According to the present invention, surface electrons generated by thermal excitation or electrons generated by incident light and accumulated on the surface are removed using a surface charge drain. Therefore, it is possible to minimize dark current and prevent noise generated by surface charges.

In addition, according to the present invention, electric charges generated near the surface are discharged through a surface charge drain. Therefore, the photodiode is not sensitively affected by a surface potential which is sensitive to a doping profile of the surface. As a result, variations between pixels can be prevented.

What is claimed is:

1. An image sensor photodiode arrangement comprising:
   a photodiode which is defined by a field region in a predetermined shape and formed in an active region;
   a floating diffusion region arranged in one side of the photodiode;
   a transfer gate which is formed between the photodiode and the floating diffusion region, partially overlapped with the photodiode, and arranged in parallel with the photodiode;
   a reset gate arranged in an active region at one side of the floating diffusion region;
   a power voltage terminal which is formed in one side of the reset gate and receives a power voltage; and
   an active layer which is formed between the power voltage terminal and the photodiode to discharge electrons accumulated on a surface of the photodiode.

2. The image sensor photodiode arrangement according to claim 1, wherein the active layer has a low*P-type or N-type doping concentration.

3. An image sensor photodiode arrangement comprising:
   a photodiode which is defined by a field region in a predetermined shape and formed in an active region;
   a floating diffusion region arranged in one side of the photodiode;
   a transfer gate which is formed between the photodiode and the floating diffusion region, partially overlapped with the photodiode, and arranged in parallel with the photodiode;
   a reset gate arranged in an active region at one side of the floating diffusion region;
   a power voltage terminal which is formed in one side of the reset gate and receives a power voltage; and
   a muting gate which is formed between the power voltage terminal and the photodiode to discharge electrons accumulated on a surface of the photodiode.

4. The image sensor photodiode arrangement according to claim 3, wherein the muting gate is constructed to electrically connect the surface of the photodiode and the power voltage terminal to each other when it receives a voltage higher than a threshold level set to 0.4 to 0.6V.

5. An image sensor photodiode arrangement constructed to remove electrons generated from a surface of a photodiode by applying a voltage of a power voltage terminal to a muting gate before an integration time period to electrically connect the surface of the photodiode and a power voltage terminal of an adjacent pixel, wherein when the muting gate is turned off, a threshold voltage is applied to the muting gate to maintain electrical connection between the surface of the photodiode and the power voltage terminal of the adjacent pixel.

6. The image sensor photodiode arrangement according to claim 5, wherein the photodiode is constructed to supply the voltage of the power voltage terminal when the transfer gate is turned on, and apply the threshold voltage when the transfer gate is turned off.

* * * * *